(12) United States Patent
Takiguchi

(10) Patent No.: US 6,511,889 B2
(45) Date of Patent: Jan. 28, 2003

(54) REFERENCE VOLTAGE SUPPLY CIRCUIT HAVING REDUCED DISPERSION OF AN OUTPUT VOLTAGE

(75) Inventor: Tomio Takiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/878,972

(22) Filed: Jun. 13, 2001

(65) Prior Publication Data

US 2001/0040254 A1 Nov. 15, 2001

Related U.S. Application Data

(63) Continuation of application No. 09/352,593, filed on Jul. 14, 1999, now Pat. No. 6,313,515.

(30) Foreign Application Priority Data

Jul. 16, 1998 (JP) ............................................ 10-201841

(51) Int. Cl.[7] .......................................... H01L 21/8222
(52) U.S. Cl. ...................................... 438/331; 438/329
(58) Field of Search ................................. 438/329, 331

(56) References Cited

U.S. PATENT DOCUMENTS

| 3,816,762 A | 6/1974 | Holt, Jr. |
| 3,829,709 A | 8/1974 | Maigret et al. |
| 3,922,707 A | 11/1975 | Freed et al. |
| 4,258,311 A | 3/1981 | Tokuda et al. |
| 4,295,088 A | 10/1981 | Malchow |
| 4,725,876 A | 2/1988 | Kishi |
| 4,898,837 A | 2/1990 | Takeda et al. |
| 5,223,737 A | 6/1993 | Canclini |
| 5,229,710 A | 7/1993 | Kraus et al. |
| 5,237,195 A | 8/1993 | Sadamatsu |
| 5,679,593 A | 10/1997 | Miller, Jr. et al. |
| 5,691,214 A | 11/1997 | Wakabayasahi |

FOREIGN PATENT DOCUMENTS

| JP | 3-30186 | 2/1991 |
| JP | 4-312107 | 11/1992 |
| JP | 6-59751 | 3/1994 |
| JP | 6-204838 | 7/1994 |
| JP | 9-102549 | 4/1997 |

OTHER PUBLICATIONS

J. Micheida et al., "A Precision CMOS Bandgap Reference", IEEE Journal of Solid–State Circuits, vol. sc–19, No. 6, Dec. 1984, pp. 1014–1021.

Song, et al., "A Precision Curvanture–Compensated CMOS Bandgap Reference", IEEE Journal of Solid–State Circuits, vol. sc–18, No. 6, Dec. 1983, pp. 634–643.

Primary Examiner—John F. Niebling
Assistant Examiner—Christopher Lattin
(74) Attorney, Agent, or Firm—Whitham, Curtis & Christofferson, PC

(57) ABSTRACT

A reference voltage supply circuit is provided with a PNP transistor. The PNP transistor has an N-type well for a base formed at a surface of a P-type semiconductor substrate. The reference voltage supply circuit is further provided with a resistor element connected to an emitter of the PNP transistor. The resistor element has an N-type well for a resistor at the surface of the P-type semiconductor substrate. The well is fabricated at the same time as when the N-type well for a base is fabricated.

8 Claims, 9 Drawing Sheets

REFERENCE VOLTAGE SUPPLY CIRCUIT HAVING REDUCED DISPERSION OF AN OUTPUT VOLTAGE

CROSS REFERENCE TO RELATED APPLICATIONS

The present application is a continuation of application Ser. No. 09/352,593, filed on Jul. 14, 1999, now U.S. Pat. No. 6,313,515, herein incorporated by reference.

BACKGROUND OF THE INVENTION

1. Field of the Invention

The present invention relates a reference voltage supply circuit which is used as a power supply circuit for an integrated circuit or such and particularly, to a reference voltage supply circuit, dispersion of whose reference output voltage caused by a fabrication process or such is suppressed.

2. Description of the Prior Art

When a reference voltage supply circuit is provided in a semiconductor device, a reference voltage supply circuit has in many cases been fabricated by a bipolar process, which is widely used for fabrication of an analogue circuit since there is a necessity of increasing relative precision of elements and precision in absolute value of a resistor. The reason why is also that since it is an analogue circuit that requires a reference voltage supply circuit, there is no other choice but to employ a bipolar process.

In recent years, an analogue circuit has been built even in a CMOS process which is used for a digital circuit in company with progress in integration of circuitry. Hence, there arises a necessity for a reference voltage supply circuit to be incorporated in a CMOS process.

FIG. 1 is a circuit diagram showing a conventional reference voltage supply circuit. The reference voltage supply circuit comprises two PNP transistors Q31 and Q32 whose collectors and bases are grounded. Resistor elements RE33 and RE32 are serially connected to the emitter of the transistor Q32 in that order. Further, a resistor element RE31 is connected to the emitter of the transistor Q31. The input terminal of an amplifier AMP31 is connected to a connection point between the emitter of the transistor Q31 and the resistor element RE31 and a connection point between the resistor elements RE32 and RE33. The resistor elements RE31 and RE32 are connected to each other and the connection point is connected to the output terminal of the amplifier AMP31. A voltage output terminal OUT31 is connected to the output terminal of the amplifier AMP31. In the mean time, the amplifier AMP31 includes plural elements such as a CMOS transistor.

A method to construct a reference voltage supply circuit as described above using a CMOS process is described, for example, in a reference "A Precision Curvature-Compensated CMOS Bandgap Reference:" p634–643 of IEEE JOURNAL OF SOLID-STATE CIRCUITS, VOL. SC-18, No. 6, DECEMBER, 1983.

FIG. 2 is a schematic sectional view showing a resistor and a PNP transistor provided in a conventional reference voltage supply circuit. A resistor and a PNP transistor provided in a conventional circuit are fabricated at the surface of a P$^-$-substrate 100, as shown in FIG. 2. Two N$^-$-wells 101a and 101b are selectively formed at the surface of a P$^-$-substrate 100. Further, an N$^+$-diffused layer 102a and a P$^+$-diffused layer 102b are formed at a surface of the N$^-$-well 101a. Two terminals 130b and 103c are connected to the P$^+$-diffused layer 102b. A well bias terminal 103a is connected to the N$^+$-diffused layer 102a. In such a manner, the resistor element 104 is constructed.

On the other hand, a P$^+$-diffused layer 106 and an N$^+$-diffused layer 105 are formed at a surface of the N$^-$-well 101b. An emitter terminal 109 is connected to the P$^+$-diffused layer 106 and a base terminal 108 is connected to the N$^+$-diffused layer 105. Further, a P$^+$-diffused layer 107 is formed at the surface of a P$^-$-substrate 100 at a position so that the N$^+$-diffused layer 105 is placed between the P$^+$-diffused layers 106 and 107. A collector terminal 110 is connected to the P$^+$-diffused layer 107. In such a manner, a PNP transistor 111 is constructed.

A process for fabrication of a reference voltage supply circuit including a resistor and a transistor with such constructions has easily been realized in a process for fabrication of a digital circuit including a CMOS transistor which is provided in the amplifier AMP31.

However, in a recent fabrication process, in which a gate length of a CMOS transistor is equal to or less than 0.5 $\mu$m, there arises a necessity to reduce a signal delay in a CMOS digital circuit as much as possible. Hence, a resistance lowering technique called Salicide (self aligned silicide) has been applied to electrodes for the gate, source and drain of a MOS transistor.

As a result, a sheet resistance $\rho$S of a resistor element with a resistor of the same width and length is on the order of 10 $\Omega/\square$ and magnitudes of a sheet resistance $\rho$ S of electrodes for a gate, source and drain have a tendency to further decrease together with future progress in a CMOS transistor process.

On the other hand, a desired value of resistance of a resistor element provided in a reference voltage supply circuit is a very large value in the range of some tens of k$\Omega$ to several M$\Omega$. When a large current flows through the base, emitter or collector of a bipolar transistor provided in a reference voltage supply circuit, a voltage drop in diffused layers of the collector, emitter and base including those of electrodes cannot be neglected, if the resistance of the resistor element is lower. That eventually causes undesirable shift from ideal electrical characteristics of a bipolar transistor. Therefore, a current is desired to be small.

In order to fabricate a resistor with a resistance in the range of some tens of k$\Omega$ to several M$\Omega$ in a recent CMOS semiconductor fabrication process using a Salicide technique, when the resistor is fabricated using an electrode material for a gate, source or drain having a small resistance per a unit area, a length of the resistor is required to be very long on a semiconductor substrate. For example, if a resistor with a resistance of 20 k$\Omega$ and a width of 2 $\mu$m is fabricated using a material of $\rho$S =10 $\Omega/\square$, a necessary length is as long as 4 mm. That is, a large area is consumed for a resistor element. However, since a fabrication cost per a unit area of a recent CMOS transistor is high, a low resistor material is not suitable for the gate, source or drain of a CMOS transistor.

In such circumstances, there is available a method in which, in order that a resistance of a resistor element is prevented from being lowered without increase in the number of fabrication process steps, an LDD (Lightly Doped Drain) diffused layer is used as a resistor element instead of the resistor shown in FIG. 2. The LDD diffused layer is introduced in a recent CMOS circuit in order to improve an ability to endure ESD (electrostatic destruction) by preventing local intensification of an electric field in the vicinity of the drain. An LDD diffused layer is formed as a shallow layer at the surface of a semiconductor substrate in a region in which the source and drain are fabricated. A sheet resistance ρS of the LDD diffused layer is several kΩ and the highest value encountered in a recent semiconductor fabrication process.

However, an LDD diffused layer is a very thin layer formed at the surface of a semiconductor substrate and fabricated in an early stage of a fabrication process. Therefore, the LDD diffusion layer has a fault that resistance dispersion thereof becomes large compared with other resistors by influences of surface treatments of the semiconductor substrate after the formation of the layer in the fabrication process such as an etching step. As a result, dispersion of an output voltage in absolute value of a reference voltage supply circuit is larger.

Further, there is also available a method in which, in order that a resistor material with a high sheet resistance is built in a different way, the gate electrode formed on a semiconductor substrate is protected so as not to be transformed to a Salicide and thereby a high resistance is secured. FIG. 3 is a schematic sectional view showing a resistor and a PNP transistor which are provided in another conventional reference voltage supply circuit.

A resistor and a PNP transistor provided in another conventional reference voltage supply circuit in which the gate electrode is used as a resistor element are formed on the surface of a $P^-$-substrate 120, as shown in FIG. 3. An $N^-$-well 121 is selectively formed at the surface of the $P^+$-substrate 120. Further, a gate electrode 122 made of polysilicon is selectively formed on a region of the $P^+$-substrate 120 in which the $N^-$-well 121 is not formed. Two terminals 123a and 123b are connected to the gate electrode 122. In such a manner, a resistor element 124 is constructed.

On the other hand, a $P^+$-diffused layer 126 and an $N^+$-diffused layer 125 are formed at the surface of the $N^-$-well 121. An emitter terminal 129 is connected to the $P^{30}$-diffused layer 126 and a base terminal 128 is connected to the $N^+$-diffused layer 125. Further, a $P^+$-diffused layer 127 is formed at the surface of the $P^-$-substrate 120 so that the $N^+$-diffused layer 125 is placed between the $P^+$-diffused layers 126 and 127. A collector terminal 130 is connected to the $P^+$-diffused layer 127. In such a manner, a PNP transistor 131 is constructed.

However, in order to fabricate a high resistivity polysilicon resistor (gate electrode 122) showing such a high sheet resistance ρS, at least one dedicated mask is required. Hence, there arises a problem that a cost is raised due to increase in number of fabrication steps due to this requirement.

Further, when a change to a resistor made of a LDD diffused layer and use of a polysilicon resistor are effected, there arises a fault that dispersion in absolute value of an output voltage of a reference voltage supply circuit is large compared with the conventional technique in FIG. 2. This is because, since a material different from a semiconductor material constituting the base, emitter or collector of a PNP transistor is used, a shift in electric characteristics of a PNP transistor and dispersion of a resistor element independently act on dispersion of an output voltage in absolute value of a reference voltage supply circuit unfavorably.

Therefore, as a method to solve a fault that dispersion characteristics of a resistor and a PNP transistor independently affect dispersion of output voltage, an example in which an N type semiconductor substrate is adopted is described in "A Precision CMOS Bandgap Reference": IEEE JOURNAL OF SOLID-STATE CIRCUITS, VOL. SC-19, No. 6, DECEMBER 1984, P1014–1021.

FIG. 4A is a schematic sectional view showing a CMOS transistor provided in a conventional reference voltage supply circuit which is described in the prior art reference and FIG. 4B is a schematic sectional view showing a resistor and a bipolar transistor provided in the conventional reference voltage supply circuit.

A CMOS transistor provided in the conventional reference voltage supply circuit is formed at the surface of an $N^-$-substrate 141. A $P^-$-well 142 is selectively formed at the surface of the $N^-$-substrate 141. Further, two $P^+$-diffused layers 143a and 143b are formed at the surface of the $P^-$-well 142 and two $N^+$-diffused layers 144a and 144b are formed between $P^+$-diffused layers 143a and 143b. A gate insulating film (not shown) is formed on the $P^-$-well 142 between the $N^+$-diffused layers 144a and 144b, and a gate electrode 145 is formed on the gate insulating film. A well bias terminal 146 is connected to the $P^+$-diffused layers 143a and 143b. A drain terminal 147 is connected to the $N^+$-diffused layer 144a. A source terminal 148 is connected to the $N^+$-diffused layer 144b. A gate electrode terminal 149 is connected to the gate electrode 145.

Further, two $N^+$-diffused layers 151a and 151b are formed at the surface of the $N^-$-substrate 141 in a region in which the $P^-$-well 142 is not formed and two $P^+$-diffused layers 152a and 152b are formed between $N^+$-diffused layers 151a and 151b. Further, a gate insulating film (not shown) is formed on the $N^-$-substrate 141 between the $P^+$-diffused layers 152a and 152b and a gate electrode 153 is formed on the gate insulating film. A substrate bias terminal 154 is connected to $N^+$-diffused layers 151a and 151b. A drain terminal 155 is connected to the $P^+$-diffused layer 152a. A source terminal 156 is connected to the $P^+$-diffused layer 152b. A gate electrode terminal 157 is connected to the gate electrode 153.

On the other hand, a resistor and a bipolar transistor provided in a conventional reference voltage supply circuit are formed at the surface of an $N^-$-substrate 141, as shown in FIG. 4B. Two $P^-$-wells 161a and 161b are selectively formed at the surface of the $N^-$-substrate 141. Further, two $P^+$-diffused layers 162a and 162b are formed at the surface of the $P^-$-well 161a and terminals 163a and 163b are respectively connected to the $P^+$-diffused layers 162a and 162b. In such a manner, a resistor element 164 is constructed.

A $P^+$-diffused layer 165 and an $N^+$-diffused layer 166 are formed at the surface of the $P^-$-well 161b, a base terminal 168 is connected to the $P^+$-diffused layer 165 and an emitter terminal 169 is connected to the $N^+$-diffused layer 166. Further, an $N^+$-diffused layer 167 is formed at a position at the surface of the $N^-$-substrate 141 so that the $P^+$-diffused layer 165 is placed between the $N^+$-diffused layers 166 and 167. A collector terminal 170 is connected to the $N^+$-diffused layer 167. In such a manner, a transistor 171 is constructed.

Dispersion in characteristics of the $P^-$-well 161a formed at the surface of the $N^-$-substrate 141 is small compared with other regions. Hence, a reference voltage supply circuit constructed as described above has small dispersion of an output voltage in absolute value.

However, in formation of a $P^-$-well, B+ ion (boron ion) implantation, is used. A scattering distance of boron ions is comparatively large into a semiconductor substrate. This is because boron has a small mass number and is a low atomic weight material.

Further, since ions with high energy are implanted in a silicon semiconductor substrate in an ion implantation process of impurities, crystal defects are easy to be produced in the vicinity of the surface of an N-type semiconductor substrate. Therefore, an annealing process, in which a semiconductor substrate is heated, is necessary after ion implantation in order to remove the crystal defects. Impurity ions in a semiconductor substrate have a characteristic that the impurity ions diffuse from a site with a high concentration to a site with a low concentration under heating. A thermal diffusion length of a boron ion is several times as high as that of P (phosphorus) which is impurities in an N-type semiconductor device. In an ion implantation process, an impurity concentration and a size of a well can be controlled with high precision by monitoring a current, an applied voltage and time. However, when an annealing process is long or a heating temperature is high after the ion implantation, a resistor of a P⁻-well has a larger dispersion than a resistor of an N⁻-well.

Further, in the case where a CMOS circuit is fabricated with an N-type semiconductor substrate, a negative power supply is required from a view point of an electric circuit and thereby there arises a problem that an output voltage of a reference voltage supply circuit is negative. That is, such a problem is unfavorable for actual products in which a positive power supply is widely adopted.

Further a reference voltage supply circuit in which a MOS transistor is used instead of a parasitic bipolar transistor has been proposed (Japanese Patent Application Laid-Open No. Hei 6-204838). Since a MOS transistor is used instead of a parasitic bipolar transistor in the conventional reference voltage supply circuit described in the official gazette, the reference voltage supply circuit can be fabricated together with a CMOS transistor. Further dispersion of an output voltage due to a change in temperature and such is suppressed. However, an effect to suppress the dispersion is insufficient.

Besides, a generation apparatus for a threshold whose object is to sufficiently supply a charge current and discharge current to bit lines of memory arrays is proposed (Japanese Patent Application Laid-Open No. Hei 3-30186). However, while a circuit for achieving the object and its operation are disclosed in the official gazette and the object may thereby be achieved, dispersion of an output voltage cannot be suppressed by the apparatus.

SUMMARY OF THE INVENTION

It is an object of the present invention to provide a reference voltage supply circuit which not only can be fabricated without increase in fabrication cost but can also supply a reference output voltage with suppressed dispersion in a stable manner even if a sheet resistance is decreased.

According to one aspect of the present invention, a reference voltage supply circuit may comprise a P-type semiconductor substrate, a PNP transistor having an N-type well for a base formed at the surface of the P-type semiconductor substrate, and a resistor element connected to an emitter of the PNP transistor and having an N-type well for a resistor at the surface of the P-type semiconductor substrate. The N-type well for a resistor may be fabricated at the same time as when the N-type well for a base is fabricated.

In one aspect of the present invention, since the N-type well for a base and the N-type well for a resistor are simultaneously fabricated, that is since both are fabricated with the same material, dispersion of a reference output voltage which is caused by a fabrication process and such is greatly suppressed. The reason why is that thermal diffusion of impurities, for example phosphorus ions, which is used in formation of an N-type well is small.

The PNP transistor may comprise a P-type diffused layer for an emitter electrode formed at a surface of the N-type well for a base, an N-type diffused layer for a base electrode formed at the surface of the N-type well for a base, and a P-type diffused layer for a collector electrode which is fabricated at the surface of the P-type semiconductor substrate at the same time as when the P-type diffused layer for an emitter electrode is fabricated. An impurity concentration in the N-type diffused layer for a base electrode may be higher than that in the N-type well for a base. The resistor element may comprise N-type diffused layers each for a resistor electrode which are fabricated at a surface of the N-type well for a resistor at the same time as when the N-type diffused layer for a base electrode is fabricated.

Further, the resistor element preferably comprises a P-type diffused layer for bias formed between the N-type diffused layers each for a resistor electrode.

When a bias voltage is applied to the P-type diffused layer for bias, a depletion layer is produced in the vicinity of the interface between the P-type diffused layer for bias and the N-type well for a resistor. With the depletion layer produced, a sectional area of a region which acts as a resistor of the N-type well is decreased to increase a resistance. Accordingly, even if a resistance itself of the N-type well for a resistor is designed to be decreased, a sufficient resistance can be secured by controlling a bias voltage.

The P-type diffused layer for bias may be fabricated at the same time as when the P-type diffused layer for an emitter electrode is fabricated.

The reference voltage supply circuit may further comprise a P-channel MOS transistor which includes an N-type well for a MOS transistor and P-type diffused layers for a source and a drain. The N-type well for a MOS transistor is fabricated at the surface of the P-type semiconductor substrate at the same time as when the N-type well for a base is fabricated. The P-type diffused layers for a source and a drain are fabricated at a surface of the N-type well for a MOS transistor at the same time as when the P-type diffused layer for an emitter electrode is fabricated.

According to another aspect of the present invention, a reference voltage supply circuit may comprise an N-type semiconductor substrate, an NPN transistor, and a resistor element connected to an emitter of the NPN transistor. The NPN transistor may include a P-type well for a base formed at a surface of the N-type semiconductor substrate, an N-type diffused layer for an emitter electrode formed at a surface of the P-type well for a base, a P-type diffused layer for a base electrode formed at the surface of said P-type well for a base, and an N-type diffused layer for a collector electrode. An impurity concentration in the P-type diffused layer for a base electrode may be higher than that in the P-type well for a base. An N-type diffused layer for a collector electrode is fabricated at the surface of the N-type semiconductor substrate at the same time as when the N-type diffused layer for an emitter electrode is fabricated. The resistor element may include a P-type well for a resistor, P-type diffused layers each for a resistor electrode, and an N-type diffused layer for bias formed between the P-type diffused layers each for a resistor electrode. The P-type well for a resistor is fabricated at the surface of the N-type semiconductor substrate at the same time as when the P-type well for a base is fabricated. The P-type diffused layers each for a resistor electrode are fabricated at a surface of the P-type well for a resistor at the same time as when said N-type diffused layer for an emitter electrode is fabricated.

In the other aspect of the present invention, when a bias voltage is applied to the N-type diffused layer for bias, a depletion layer is produced in the vicinity of the interface between the N-type diffused layer for bias and the P-type well for a resistor. With the depletion layer produced, a sectional area of a region which acts as a resistor of the P-type well for a resistor is decreased to increase a resistance. Accordingly, even if a resistance itself of the P-type well for a resistor is designed to be decreased, a sufficient resistance can be secured by controlling a bias voltage.

The N-type diffused layer for bias is preferably fabricated at the same time as when the N-type diffused layer for an emitter electrode is fabricated.

The reference voltage supply circuit may further comprise an N-channel MOS transistor which includes a P-type well for a MOS transistor and N-type diffused layers for a source and a drain. The P-type well for a MOS transistor is fabricated at the surface of the N-type semiconductor substrate at the same time as when the P-type well for a base is fabricated. The N-type diffused layers for a source and a drain are fabricated at a surface of the P-type well for a MOS transistor at the same time as when the N-type diffused layer for an emitter electrode is fabricated.

In such a manner, according to the present invention, since a well for a base and a well for a resistor are fabricated at the same time, that is since both are fabricated with the same material, dispersion of a reference output voltage which is caused by a fabrication process and such is greatly suppressed.

Further, since a bipolar transistor and a resistor element can be fabricated at the same time as when a process which is used for fabrication of a CMOS transistor provided in a conventional reference voltage supply circuit is performed, fabrication steps are prevented from increasing in number.

DETAILED DESCRIPTION OF THE PREFERRED EMBODIMENTS

Below, reference voltage supply circuits according to embodiments of the present invention will be detailed with reference to the accompanying drawings.

Figure 1:
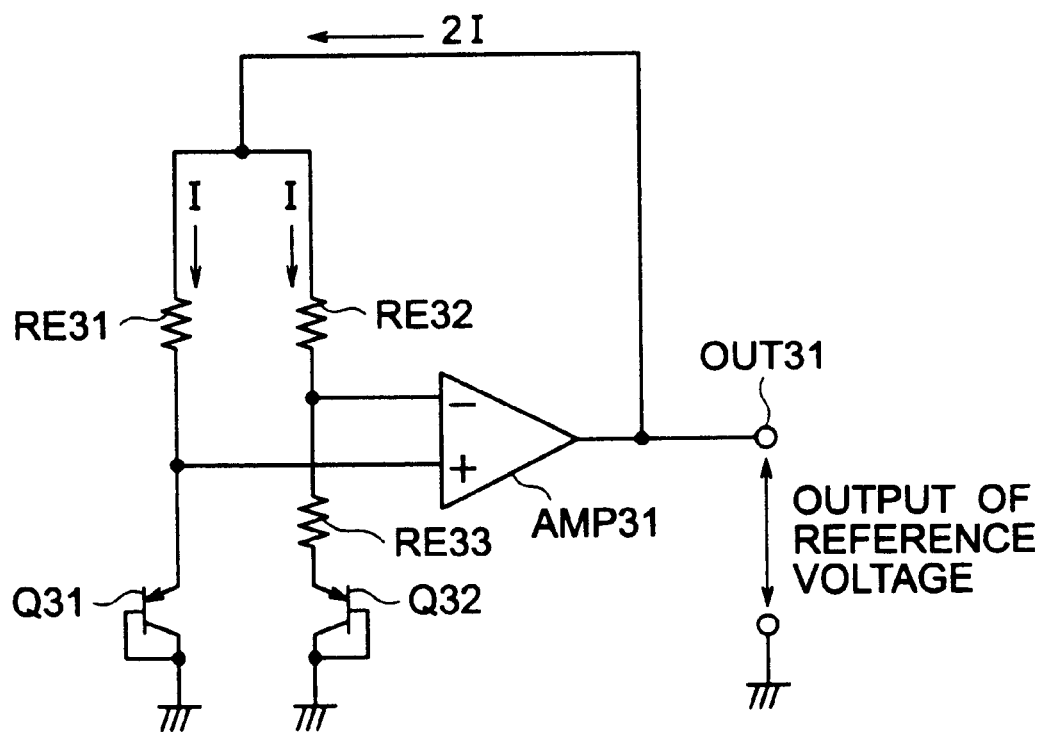
FIG. 1 is a circuit diagram showing a conventional reference voltage supply circuit.
Figure 2:
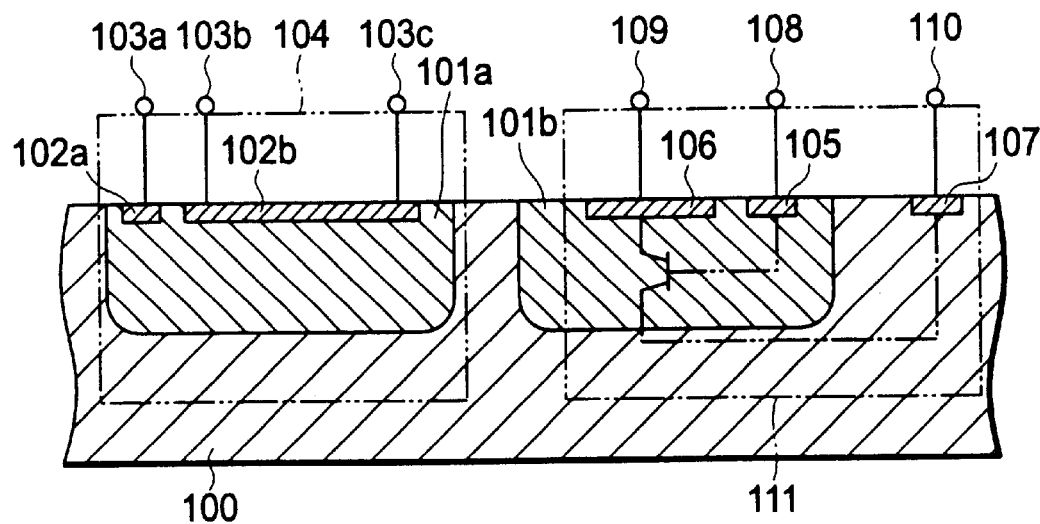
FIG. 2 is a schematic sectional view showing a resistor and a PNP transistor provided in a conventional reference voltage supply circuit.
Figure 3:
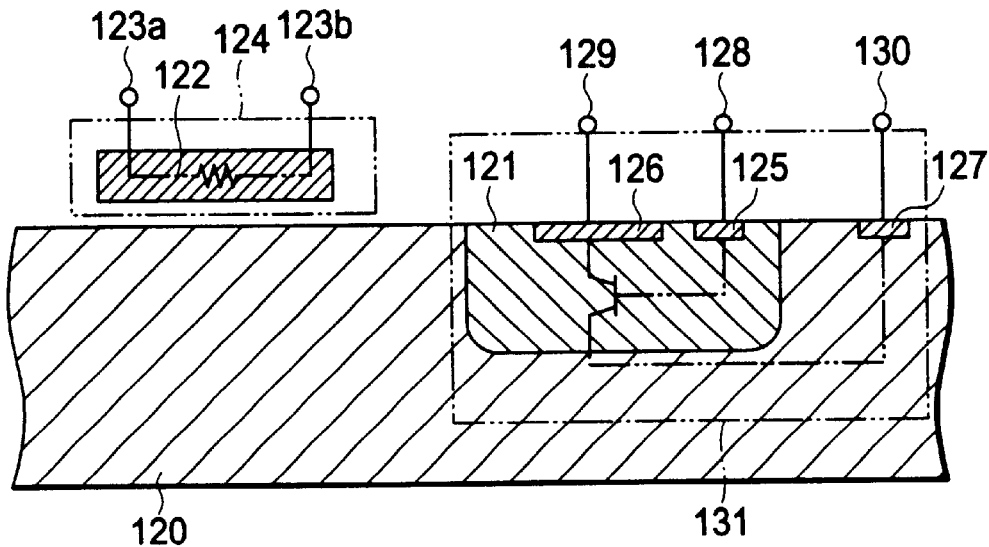
FIG. 3 is a schematic sectional view showing a resistor and a PNP transistor provided in another conventional reference voltage supply circuit.
Figure 4A:
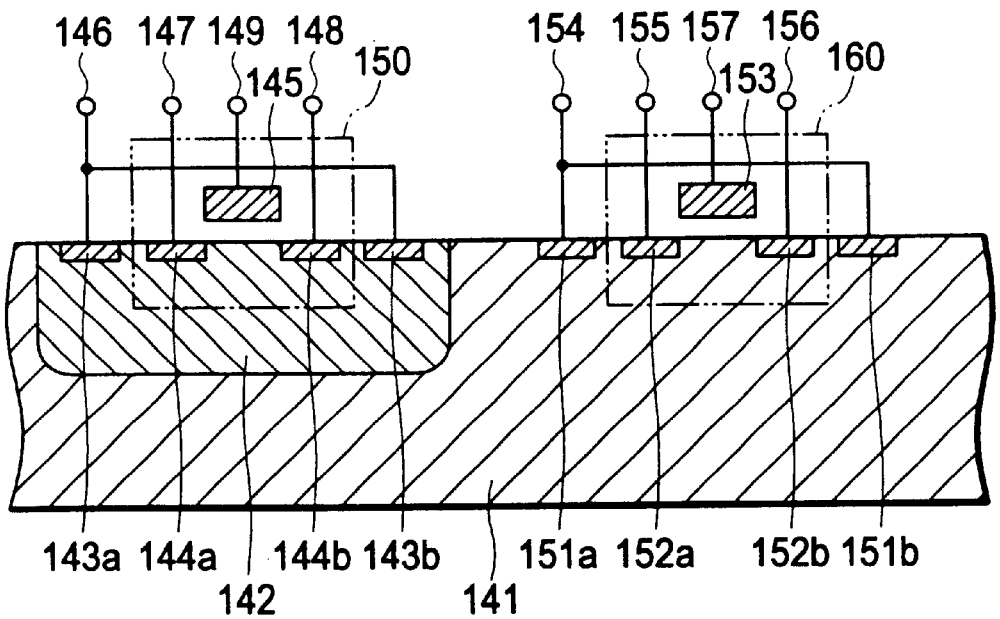
FIG. 4A is a schematic sectional view showing a CMOS transistor provided in a conventional reference voltage supply circuit which is described in a prior art reference and FIG. 4B is a schematic sectional view showing a resistor and a bipolar transistor provided in the conventional reference voltage supply circuit.
Figure 4B:
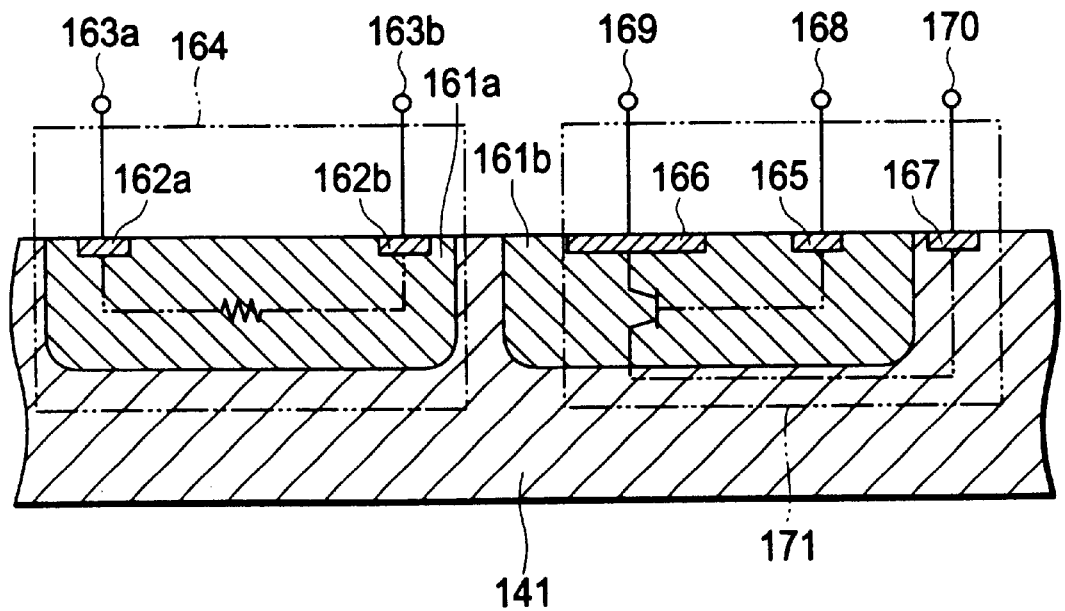
Figure 5:
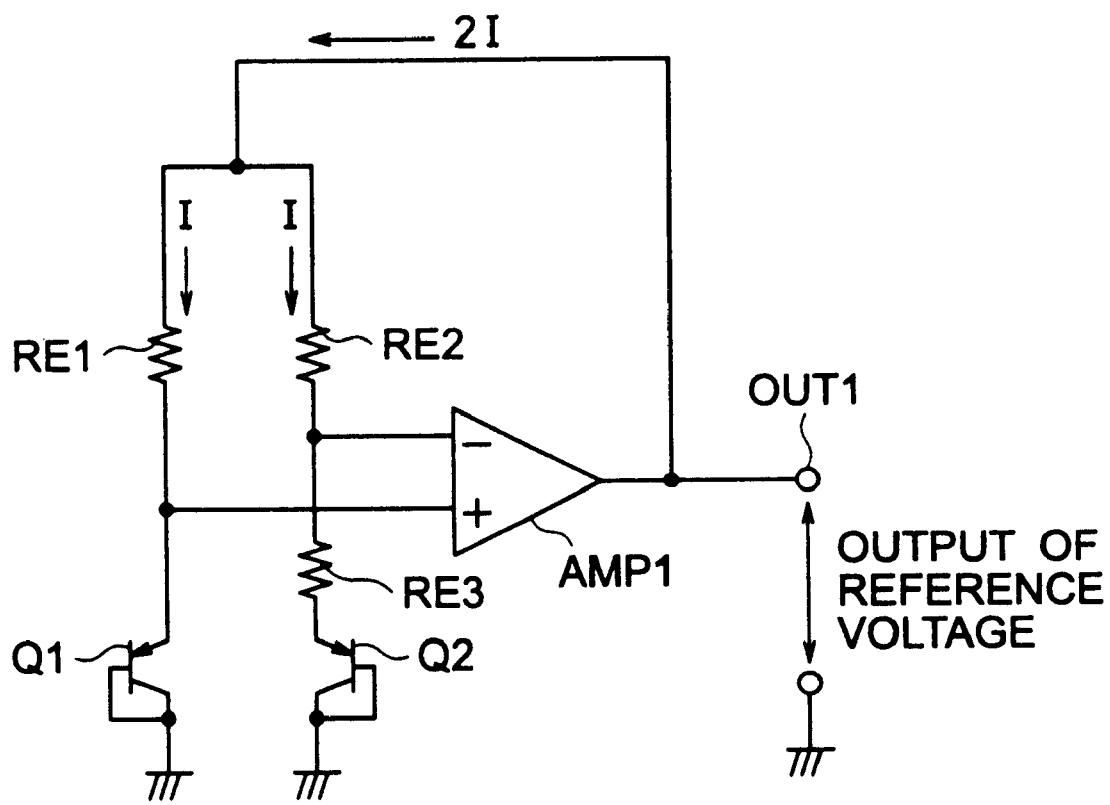
FIG. 5 is a circuit diagram showing a reference voltage supply circuit according to a first embodiment of the present invention.

A reference voltage supply circuit according to the first embodiment of the present invention has a circuit construction similar to a conventional circuit shown in FIG. 1 but a resistor and a PNP transistor are different from those in the conventional circuit in structure. FIG. 5 is a circuit diagram showing a reference voltage supply circuit according to the first embodiment of the present invention.

The reference voltage supply circuit may comprise two PNP transistors Q1 and Q2 whose collectors and bases are both grounded. Resistor elements RE3 and RE2 are serially connected to the emitter of the transistor Q2 in that order. Further, a resistor element RE1 is connected to the emitter of the transistor Q1. Input terminals of an amplifier AMP1 are connected to a connection point between the emitter of the transistor Q1 and the resistor element RE1 and a connection point between the resistor element RE2 and the resistor element RE3. The resistor elements RE1 and RE2 are connected to each other and the connection point is connected to an output terminal of the amplifier AMP1. A voltage output terminal OUT1 is connected to the output terminal of the amplifier AMP1. In the mean time, the amplifier AMP1 may include plural elements such as a CMOS transistor.

Incidentally, values of a resistance of the resistor RE1, the resistor RE2 and the resistor element RE3 are respectively "R1", "R2" and "R3". The resistance values "R1" and "R2" are equal to each other and no change due to temperature arises. An emitter junction area of the transistor Q1 is "M" and an emitter junction area of the transistor Q2 is "N". Further, a gain of the amplifier AMP 1 is infinite, an input leakage current and an output resistance are both 0 and there is no differential input offset. Base currents of the transistors Q1 and Q2 are so small as to be negligible compared with collector currents thereof. Besides, in the embodiment, when an elementary electric charge is "q" and the Boltzmann constant is "k", a relation showing in the following mathematical expression 1 is established.

$$\left(1 + \frac{R2}{R3}\right) \cdot \frac{k}{q} \cdot \ln\left(\frac{N}{M}\right) = 2(\mathrm{mV}/^\circ \mathrm{C.}) \tag{1}$$

Figure 6A:
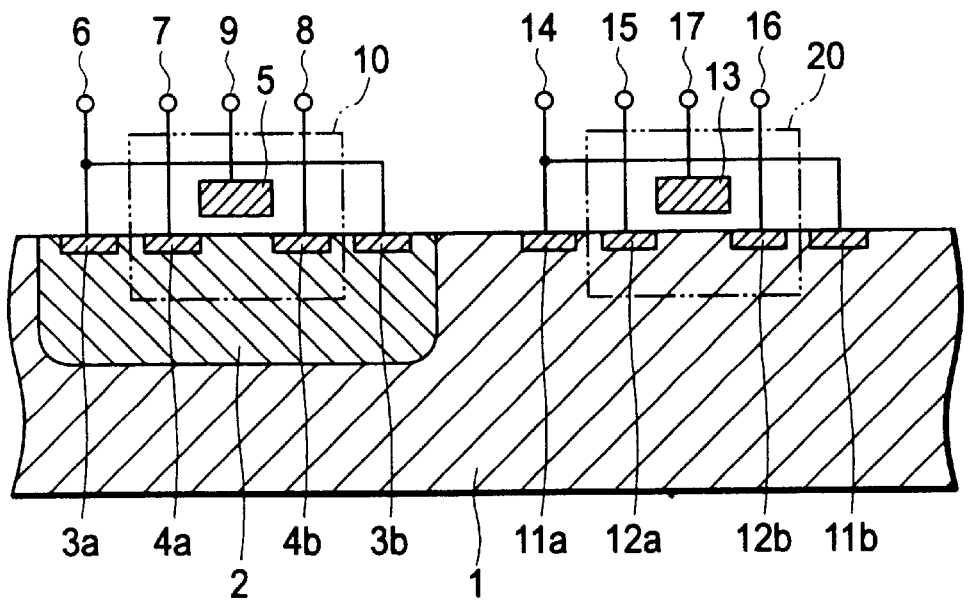
FIG. 6A is a schematic sectional view showing a CMOS transistor provided in a reference voltage supply circuit according to the first embodiment of the present invention and FIG. 6B is a schematic sectional view showing a resistor and a bipolar transistor provided in the reference voltage supply circuit.
Figure 6B:
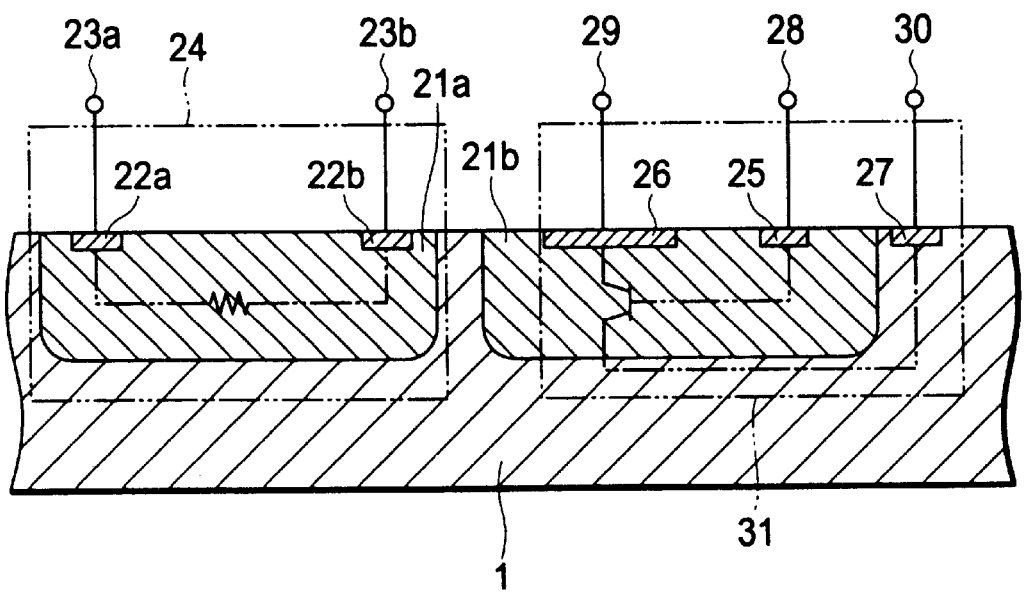

FIG. 6A is a schematic sectional view showing a CMOS transistor provided in a reference voltage supply circuit according to the first embodiment of the present invention and FIG. 6B is a schematic sectional view showing a resistor and a bipolar transistor provided in the reference voltage supply circuit.

The CMOS transistor provided in the first embodiment is formed at the surface of a P⁻-type substrate, as shown in FIG. 6A. An N⁻-well 2 is selectively formed at the surface of the P⁻-substrate 1. Two N⁺-diffused layers 3a and 3b are formed at the surface of the N⁻-well 2. Two P⁺-diffused layers 4a and 4b are formed between the two N⁺-diffused layers 3a and 3b. Further, a gate insulating film (not shown) is formed on the N⁻-well 2 between the P⁺-diffused layers 4a and 4b. A gate electrode 5 is formed on the gate insulating film. The gate electrode 5 may be made of polysilicon, for example. Further, a well bias terminal 6 is connected to the N⁺-diffused layers 3a and 3b. A drain terminal 7 is connected to the P⁺-diffused layer 4a. A source terminal 8 is connected to the P⁺-diffused layer 4b. A gate electrode terminal 9 is connected to the electrode 5. In such a manner, a P-channel MOS transistor 10 comprising the N⁻-well 2, the two P⁺-diffused layers 4a and 4b, and the gate electrode 5 may be constructed.

Two P⁺-diffused layers 11a and 11b are formed at the surface of the P⁻-substrate 1 in a region where no N⁻-well 2 is formed. Two N⁺-diffused layers 12a and 12b are formed between the two P⁺-diffused layers 11a and 11b. Further, a gate insulating film (not shown) is formed on the P⁻-substrate 1 between the N⁺-diffused layers 12a and 12b. A gate electrode 13 is formed on the gate insulating film. The gate electrode may be made of polysilicon, for example. A substrate bias terminal 14 is connected to the P⁺-diffused layers 11a and 11b. A drain terminal 15 is connected to the N⁺-diffused layer 12a. A source terminal 16 is connected to the N⁺-diffused layer 12b. A gate electrode terminal 17 is connected to the gate electrode 13. In such a manner, an N-channel MOS transistor 20 comprising, the P⁻-substrate 1, the N⁺-diffused layers 12a and 12b, and the gate electrode 13 may be constructed.

On the other hand, a resistor element and a PNP transistor are formed at the surface of the P⁻-substrate 1, as shown in FIG. 6B. Two N⁻-wells 21a and 21b are selectively formed at the surface of the P⁻-substrate 1. Further two N⁺-diffused layers 22a and 22b are formed at the surface of the N⁻-well 21a. Terminals 23a and 23b are respectively connected to the N⁺-diffused layers 22a and 22b. In such a manner, a resistor element 24 may be constructed.

An N⁺-diffused layer 25 and a P⁺-diffused layer 26 are formed at the surface of the N⁻-well 21b. A base terminal 28 is connected to an N⁺-diffused layer 25 and an emitter terminal 29 is connected to a P⁺-diffused layer 26. Further a P⁺-diffused layer 27 is formed at the surface of the P⁻-substrate 1 so that the N⁺-diffused layer 25 is placed between the P⁺-diffused layer 26 and the P⁺-diffused layer 27. A collector terminal 30 is connected to the P⁺-diffused layer 27. In such a manner, a PNP transistor 31 may be constructed.

The resistor elements RE1, RE2 and RE3 each have a construction similar to the resistor element 24 and the transistors Q1, Q2 have a construction similar to the transistor 31.

Incidentally, the N⁻-wells 2, 21a and 21b are fabricated in the same process, the N⁺-diffused layers 3a, 3b, 12a, 12b, 22a, 22b and 25 are fabricated in the same process and the P⁺-diffused layers 4a, 4b, 11a, 11b, 26 and 27 are fabricated in the same process.

In a reference voltage supply circuit of the embodiment constructed in such a manner, a gain of amplifier AMP1 is infinite and thereby a non-inverted input potential on the plus side and an inverted input potential on the minus side are equal in an equilibrium condition. Further, since resistance values of the resistor elements RE1 and RE2 are equal, potentials between terminals thereof are also equal. That is, a current which flows through the resistor element RE1 and the transistor Q1 and a current which flow through the resistor elements RE2 and RE3, and the transistor Q2 are equal and shows an equal value "I".

When an emitter-base voltage of the transistor Q1 is "VEB1" and an emitter-base voltage of the transistor Q2 is "VEB2", a relation between the voltages "VEB1" and "VEB2" is expressed by the following mathematical expression 2. A relation between a current which flows through the transistor Q2 side and an output voltage "Vout" is expressed by the following mathematical expression 3.

$$VEB1 = R3 \cdot I + VEB2 \tag{2}$$

$$Vout = (R2+R3) \cdot I + VEB2 \tag{3}$$

At this point, attentions being paid to the transistors Q1 and Q2, currents "IEQ1" and "IEQ2" flowing into the respective emitters are equal to the circuit current "I". The current "I" flowing into the emitters may be approximated by a current equation of a forward diode. Hence, a current equation shown in the following mathematical expression 4 is established on the transistor Q1 side and a current equation shown in the following mathematical expression 5 is established on the transistor Q2 side.

$$IEQ1 = I = Is \cdot \left( \exp\left( \frac{q \cdot VEB1}{k \cdot T} \right) - 1 \right) \tag{4}$$

$$IEQ2 = I = Is \cdot \left( \frac{N}{M} \right) \cdot \left( \exp\left( \frac{q \cdot VEB1}{k \cdot T} \right) - 1 \right) \tag{5}$$

In the mathematical expressions 4 and 5, "T" indicates an absolute temperature and "Is" indicates saturation current between a base and emitter.

In the mathematical expressions 4 and 5, since exp (q·VEB1/k·T) is very much larger than 1, exp (q·VEB1/k·T) −1 can be approximated by exp (q·VEB1/k·T). Further, the emitter-base voltages "VEB1", and "VEB2" shown in the following mathematical expressions 6 and 7 can be obtained with ease from natural logarithms of both sides in each of the mathematical expressions 4 and 5.

$$VEB1 = \frac{k \cdot T}{q} \cdot \ln\left( \frac{I}{Is} \right) \tag{6}$$

$$VEB2 = \frac{k \cdot T}{q} \cdot \ln\left( \frac{I}{Is \cdot \left( \frac{N}{M} \right)} \right) \tag{7}$$

The current "I" is obtained by substituting the voltages "VEB1" and "VEB2" into the mathematical expression 2. The current "I" is expressed by the following mathematical expression 8.

$$I = \frac{k \cdot T}{R3 \cdot q} \cdot \ln\left( \frac{N}{M} \right) \tag{8}$$

Then, the following mathematical expression 9 is obtained by substituting the current "I" into the mathematical expression 2.

$$Vout = VEB2 + \left(1 + \frac{R2}{R3}\right) \cdot \frac{k \cdot T}{q} \cdot \ln\left(\frac{N}{M}\right) \quad (9)$$

From the mathematical expression 9, it is shown that an output voltage "Vout" at the voltage output terminal OUT1 is influenced by an emitter-base voltage "VEB2" of the transistor Q2, a ratio between values (R2/R3) of a resistance "R2" and "R3", an emitter junction area ratio (N/M) between the transistors Q1 and Q2 and an absolute temperature "T". Especially in order to suppress dispersion of an output potential "Vout", it is not absolute precision of a resistance and a transistor but relative precision between transistors that is required as shown by the second item on the right side of the mathematical expression 9.

Incidentally, when a temperature coefficient of the voltage output terminal OUT1 is considered in the mathematical expression 9, it is only required that both sides of the expression 9 are partially differentiated with "T". A result of the partial differentiation is shown by the following mathematical expression 10.

$$\frac{\Delta Vout}{\Delta T} = \frac{\Delta VEB2}{\Delta T} + \left(1 + \frac{R2}{R3}\right) \cdot \frac{k}{q} \cdot \ln\left(\frac{N}{M}\right) \quad (10)$$

A temperature dependency of an emitter-base voltage "VEB2" of the transistor Q2 changes more or less according to a current flowing therethrough and normally assumes a magnitude of the order of −2 (mV/° C.). In the embodiment, since a relation shown by the mathematical expression 1 is established with respect to a resistance ratio (R2/R3) and an emitter junction area ratio (N/M), (i.e. a temperature characteristic of the voltage "VEB2" is canceled) a temperature coefficient of the output voltage "Vout" substantially assumes 0 (mV/° C.). Accordingly, in a reference voltage supply circuit of the embodiment, an output voltage does not vary with changes in temperature, which is preferable for a reference voltage supply circuit.

An influence on dispersion of the output voltage "Vout" due to variation in characteristics of elements provided in a reference voltage supply circuit will be studied with respect to the mathematical expression 9.

Since the second item of the expression 9 is dependent on relative precision as mentioned above, even if elements have variation in characteristics, dispersion in the output voltage "Vout" does not occur. On the other hand, if the voltage "VEB2" of the first item suffer from dispersion, dispersion of the output voltage "Vout" becomes large. The saturation current "Is" and the emitter current "I" as shown in the mathematical expression 7, may be causes of the dispersion. When a current "I" shown by the mathematical expression 8 is substituted into the mathematical expression 7, the mathematical expression 11 is obtained.

$$VEE2 = \frac{k \cdot T}{q} \cdot \ln\left(\frac{\frac{k \cdot T}{R3 \cdot q} \cdot \ln\left(\frac{N}{M}\right)}{Is \cdot \left(\frac{N}{M}\right)}\right) = \frac{k \cdot T}{q} \cdot \ln\left(\frac{k \cdot T \cdot \ln\left(\frac{N}{M}\right)}{q \cdot R3 \cdot Is \cdot \left(\frac{N}{M}\right)}\right) \quad (11)$$

As shown in the mathematical expression 11, a change in a voltage "VEB2" caused by variation in characteristics of an element is influenced by dispersion of a base-emitter saturation current "Is" in the transistor Q1, dispersion of a resistance "R3" in absolute value and dispersion of an emitter junction area ratio (N/M) between the transistors Q1 and Q2. Among the parameters, since the dispersion of an emitter junction area ratio between the transistors Q1 and Q2 acts by relative precision, it can be suppressed to be small by a way of arrangement of elements on a semiconductor substrate. Therefore, characteristics of an element which is influential on dispersion of the voltage "VEB2" are the resistance "R3" in absolute value and the saturation currents "Is" of the transistors Q1 and Q2.

In the mathematical expression 11, a factor of a change in the voltage "VEB2" is a product of the resistance "R3" and the saturation current "Is". When a material of the resistor elements RE1, RE2 and RE3 and a material of the PNP transistors Q1 and Q2 are different from each other and dispersions thereof are large, dispersion of the voltage "VEB2" is larger due to a synergetic effect of the resistance "IR3" and the saturation current "Is". However, in the embodiment, since the N⁻-well of the resistor element RE3 and the N⁻-well of a transistor are fabricated in the same process, the same variable as a variable which determines the saturation current "Is" can be used as a variable which determines the resistance "R3". That is, if a change in the saturation current "Is" may be suppressed to be small, a change in the resistance "R3" is also suppressed at the same time and thereby a change in the voltage "VEB2" can further be suppressed to be small.

Below, a factor of changes in the saturation current "Is" and the resistance "R3" will be described.

The saturation current "Is" is expressed by the following mathematical expression 12 based on a forward diffusion current equation.

$$Is = q \cdot M \cdot ni^2 \cdot \left(\frac{Dp}{LB \cdot ND} + \frac{Dn}{LE \cdot NA}\right) \quad (12)$$

Variables in the mathematical expression 12 means as shown in the following table 1.

TABLE 1

| | |
|---|---|
| Ni | An intrinsic carrier concentration of silicon |
| LB | a base width |
| LE | An emitter width |
| ND | An impurity concentration in an N⁻-well |
| NA | An impurity concentration in a P⁺-diffused layer |
| Dp | a hole diffusion coefficient in a base |
| Dn | An electron diffusion coefficient in an emitter |

An impurity concentration "ND" in an N-type base is set so as to be smaller than an impurity concentration "NA" of a P-type emitter by about two to three orders of magnitudes in decimal numeral. Hence, the second item in parentheses of the right side of the mathematical expression 12 can be smaller than the first item so as to be negligible. When an equation showing a relation $Dp = k \cdot T \cdot \mu_p/q$ between a diffusion coefficient and an electron mobility "$\mu_p$" in a P⁺-diffused layer into the mathematical expression 12, the following mathematical expression 13 is derived.

$$Is = q \cdot M \cdot ni^2 \cdot \left(\frac{Dp}{LB \cdot ND}\right) = M \cdot ni^2 \cdot k \cdot T \cdot \mu_p \cdot \left(\frac{1}{LB \cdot ND}\right) \quad (13)$$

On the other hand, the resistance "R3" is expressed by the following mathematical expression 14.

$$R3 = \frac{Lr}{\mu_n \cdot q \cdot ND \cdot LN \cdot Wr} \quad (14)$$

Variables in the mathematical expression 14 means as shown in the following table 2.

TABLE 2

| | |
|---|---|
| $\mu_n$ | an electron mobility in an N⁻-well |
| Lr | a length of a resistor of the N⁻-well |
| LN | a width from a substrate surface of the N⁻-well |
| Wr | a width of a resistor of the N⁻-well |

If the mobilities each "$\mu_p$" and "$\mu_n$" are a constant without any dispersion, the saturation current "Is" and the resistance "R3" are in inverse proportion to an impurity concentration "ND" in the N⁻-well. A product of the saturation current "Is" and the resistance "R3" is expressed by the following mathematical expression 15.

$$R2 \cdot Is = \frac{k \cdot T \cdot ni^2}{q} \cdot \left(\frac{Lr}{Wr}\right) \cdot \left(\frac{\mu_p}{\mu_n}\right) \cdot \left(\frac{1}{ND}\right)^2 \cdot \frac{1}{LB \cdot LN} \quad (15)$$

In an actual aspect, the mobilities "$\mu_p$" and "$\mu_n$" are not constant but are changed by changes in temperature. In general, it has been established that an influence of scattering of carriers by lattice vibration (phonon) on changes in the mobilities "$\mu_p$" and "$\mu_n$" are dominant in a temperature range in which integrated circuits are used. Therefore, the following mathematical expressions 16 and 17 are adopted.

$$\mu_p = UA \cdot \frac{1}{NA \cdot T^{1.5}} \quad (16)$$

$$\mu_n = UD \cdot \frac{1}{ND \cdot T^{1.5}} \quad (17)$$

In the mathematical expressions 16 and 17, "UA" is a constant relating to a hole mobility and "UD" is a constant relating to an electron mobility in an N-type region.

As shown in the mathematical expressions 16 and 17, the mobilities "$\mu_p$" and "$\mu_n$" are in inverse proportion to the impurity concentrations "NA" and "ND" respectively and the 1.5th power of the absolute temperature "T".

When the mobilities "$\mu_p$" and "$\mu_n$" shown in the mathematical expressions 16 and 17 are substituted into the mathematical expression 15, the following mathematical expression 18, which shows a product of the resistance "R3" and the saturation current "Is", is derived.

$$R3 \cdot Is = \frac{k \cdot T \cdot ni^2}{q} \cdot \left(\frac{Lr}{Wr}\right) \cdot \left(\frac{UA}{UD}\right) \cdot \left(\frac{1}{ND \cdot NA}\right) \cdot \frac{1}{LB \cdot LN} \quad (18)$$

As shown in the mathematical expression 18, factors which disperse the product of the resistance "R3" and the saturation current "Is" are 4 items of impurity concentrations "ND" and "NA", a width LB of a base region, and a width "LN" of an N⁻-well.

Control of the 4 items can be made in an ion implantation of impurities in a semiconductor process in which a recent CMOS circuit is fabricated. The impurity concentration "ND" and the N⁻-well width "LN" mainly relate to a total implanted impurity ion quantity included in the N⁻-well and implantation energy. The impurity concentration "NA" and the base region width "LB" mainly relate to a total implanted impurity ion quantity included in the P⁺-diffused layer and implantation energy. Accordingly, dispersion of a product of the resistance "R3" and the saturation current Is is suppressed by controlling implantation processes of P-type and N-type impurities to high precision. In general, in an apparatus by which ions are implanted into a semiconductor substrate, a total quantity of implanted ions are controlled by a product of an ion current and an implantation time, and implantation energy is controlled by a voltage which accelerates an ion. That is, since control of a total quantity of implanted ions and implantation energy are dependent on variables which are easy to be controlled, such as a current, a voltage and time, precision of the total quantity of implanted ions and implantation energy can easily be improved by improvement on an implantation apparatus. For this reason, according to the embodiment, control of dispersion of the output voltage "Vout" in absolute value is very much easy.

while dispersions of resistances of a resistor element using a P⁺-diffused layer and a polysilicon resistor element, fabricated in the same process as that of source and drain electrodes of a conventional CMOS transistor are ± some tens of %, dispersion of a resistance in the embodiment is equal to or less than ±10%.

Further, the N⁻-wells 2, 21a and 21b are fabricated in the same process. The N⁺-diffused layer 3a, 3b, 12a, 12b, 22a, 22b and 25 are fabricated in the same process. The P⁺-diffused layer 4a, 4b, 11a, 11b, 26 and 27 are fabricated in the same process. Hence, the number of fabrication process steps of a reference voltage supply circuit of the embodiment is very small. Therefore, it is possible to decrease time and to reduce a cost.

Figure 7:
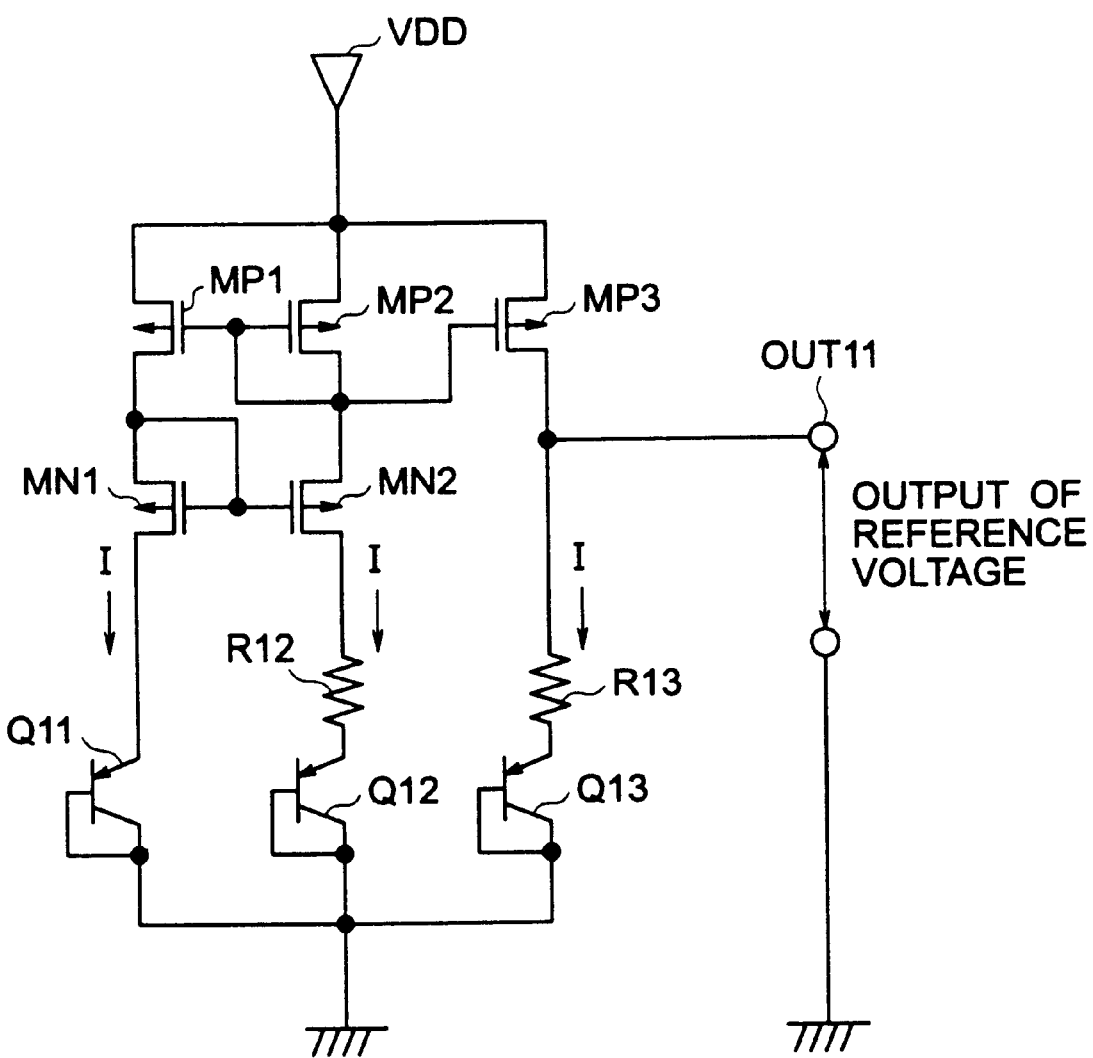
FIG. 7 is a circuit diagram showing a reference voltage supply circuit according to a second embodiment of the present invention.

Then, the second embodiment of the present invention will be described. FIG. 7 is a circuit diagram showing a reference voltage supply circuit according to the second embodiment of the present invention.

A reference voltage supply circuit of the embodiment may comprise three PNP transistors Q11, Q12 and Q13 whose collectors and bases are grounded. A resistor element RE12 is connected to the emitter of the transistor Q12 and a resistor element RE13 is connected to the emitter of the transistor Q13. Further, there is provided an N-channel MOS transistor MN1 whose source is connected to the emitter of the transistor Q11, and whose drain and gate are connected to each other. There is further provided an N-channel MOS transistor MN2 which is connected to the resistor element RE12. The gates of the N-channel MOS transistors MN1 and MN2 are connected to each other.

Besides, there is provided a P-channel MOS transistor MP1 whose source is connected to the drain of the N-channel MOS transistor MN1. The gate of the P-channel MOS transistor MP1 is connected to the drain of the N-channel MOS transistor MN2. There is provided a P-channel MOS transistor MP2 whose source is connected to the drain of the N-channel MOS transistor MN2. The gate of the P-channel MOS transistor MP2 is connected to the drain of the N-channel MOS transistor MN2. There is provided a P-channel MOS transistor MP3 whose source is connected to the resistor element RE13. The gate of the P-channel MOS transistor MP3 is connected to the drain of the N-channel MOS transistor MN2.

The drains of the P-channel MOS transistors MP1, MP2 and MP3 are set to a power supply voltage VDD. Further, a voltage output terminal OUT11 is connected to a connection point between the resistor element RE13 and the transistor MP3.

In the mean time, a resistance of the resistor element RE12 is "R12" and a resistance of the resistor element RE13 is "R13". An emitter junction area of the transistor Q11 is "M", an emitter junction area of the transistor Q12 is "N" and an emitter junction area of the transistor Q13 is "N". Three MOS transistor s, that is the P-channel MOS transistors MP1, MP2 and MP3, are transistors with the same size. With such circumstances, there is constructed a current mirror circuit, currents "I", which respectively flow in the P-channel MOS transistors MP1, MP2 and MP3 are equal. Besides, the two N-channel MOS transistors, that is N-channel MOS transistors MN1 and MN2, are of the same size.

Incidentally, in the second embodiment, a relation shown in the following mathematical expression 19 is established.

$$\left(\frac{R2}{R3}\right) \cdot \frac{k \cdot T}{q} \cdot \ln\left(\frac{N}{M}\right) = 2(\text{mV}/^\circ \text{ C.}) \quad (19)$$

Further, the PNP transistors Q11, Q12 and Q13, the P-channel MOS transistors MP1, MP2 and MP3, and the N-channel MOS transistors MN1 and MN2 are respectively of similar constructions to those in the first embodiment shown in FIG. 6B. Hence, detailed description thereon is omitted.

In the embodiment constructed in such a manner, gate-source voltages of the N-channel MOS transistors MN1 and MN2 whose gates are biased at the same voltage, whose sizes are the same and in which currents of the same quantity flow are equal to each other. Accordingly, potentials V(1) and V(2) of the sources of the respective N-channel MOS transistors MN1 and MN2 have an established relation V(1)=V(2).

Besides, base currents of the transistors Q11, Q12 and Q13 are as small as to be negligible compared with collector currents. Therefore, when the base currents of the PNP transistors Q11, Q12 and Q13 are neglected, emitter-base voltages "VEB11", "VEB12" and "VEB13", which are electrical characteristics of the PNP transistors Q11, Q12 and Q13, are approximated by a characteristic of a forward diode with a P-N junction. Then, relations shown in the following mathematical expressions 20 to 22 are established with respect to the PNP transistors Q11 and Q12.

$$VEB11 = R12 \cdot I + VEB12 \quad (20)$$

$$VEB11 = \frac{k \cdot T}{q} \cdot \ln\left(\frac{I}{Is}\right) \quad (21)$$

$$VEB12 = \frac{k \cdot T}{q} \cdot \ln\left(\frac{I}{Is \cdot \left(\frac{N}{M}\right)}\right) \quad (22)$$

Then, the current "I" is obtained by substituting voltages "VEB11" and "VEB12" shown in the mathematical expression 21 or 22 into the mathematical expression 20. This is shown in the following mathematical expression 23.

$$I = \frac{k \cdot T}{R12 \cdot q} \cdot \ln\left(\frac{N}{M}\right) \quad (23)$$

Further, a relation shown in the following mathematical expression 24 is established between the PNP transistor Q13 and the output voltage "Vout".

$$Vout = VBE13 + R13 \cdot I \quad (24)$$

The following mathematical expression 25 is derived by substituting a current "I" of the mathematical expression 23 into the mathematical expression 24.

$$Vout = VBE13 + \left(\frac{R12}{R13}\right) \cdot \frac{k \cdot T}{q} \cdot \ln\left(\frac{N}{M}\right) \quad (25)$$

A temperature dependency of the emitter-base voltage "VEB13" of the transistor Q13 changes a little according to a current flowing and normally assumes a value of the order of −2 (mV/° C.). In the embodiment, since a relation shown in the mathematical expression 19 is established, that is since a temperature characteristic of the voltage "VEB13" is canceled, a temperature coefficient of the output voltage Vout is very small. Therefore, an output voltage is hard to vary for a change in temperature in a reference voltage supply circuit of the embodiment as well and the circuit is preferable as a reference voltage supply circuit.

An influence of a spread in characteristics of each of elements provided in a reference voltage supply circuit on dispersion of the output voltage "Vout" will be studied with respect to the mathematical expression 25.

Since the second item of the mathematical expression 25 is an item dependent on relative precision, it is negligible in this case. Accordingly, an item whose value is dispersed is the first item and the voltage "VEB13" is expressed by the following mathematical expression 26.

$$VEB13 = \frac{k \cdot T}{q} \cdot \ln\left(\frac{I}{Is \cdot \left(\frac{N}{M}\right)}\right) \quad (26)$$

The following mathematical expression 27 is derived by substituting the current "I" shown in FIG. 23 into the mathematical expression 26.

$$VEB13 = \frac{k \cdot T}{q} \cdot \ln\left(\frac{k \cdot T \cdot \ln\left(\frac{N}{M}\right)}{q \cdot Is \cdot \left(\frac{N}{M}\right) \cdot R12}\right) \quad (27)$$

As shown in the mathematical expression 27, a factor which disperses the voltage 13 is a product of the resistance "R12" and the saturation current "Is" similar to the first embodiment. In the embodiment, the N⁻-well of the resistor element is fabricated in the same process as that in which the N⁻-wells of the p-channel MOS transistors MP1 and MP2 are fabricated. Further, the emitters, bases and collectors of the PNP transistors Q11, Q12 and Q13 are fabricated in the same process as that in which the P⁺-diffused layers, N⁻-wells or such of the p-channel MOS transistors MP1 and MP2 are fabricated. Therefore, A product of the resistance "R12" and the saturation current "Is" is expressed in a similar way to the mathematical expression 18. That is, a similar effect to that in the first embodiment is obtained.

Figure 8A:
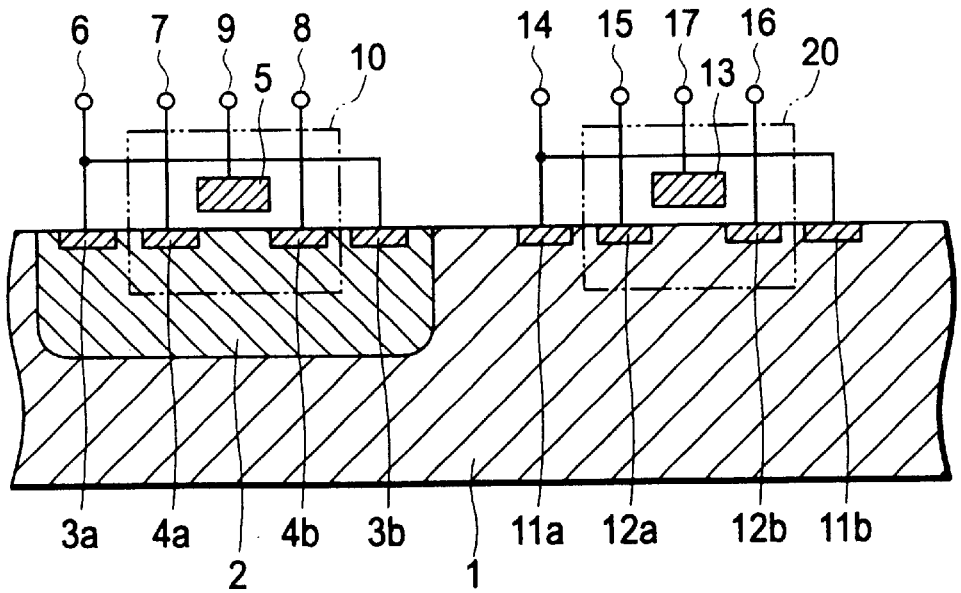
FIG. 8A is a schematic sectional view showing a CMOS transistor provided in a reference voltage supply circuit according to a third embodiment of the present invention and FIG. 8B is a schematic sectional view showing a resistor and a bipolar transistor provided in the reference voltage supply circuit.
Figure 8B:
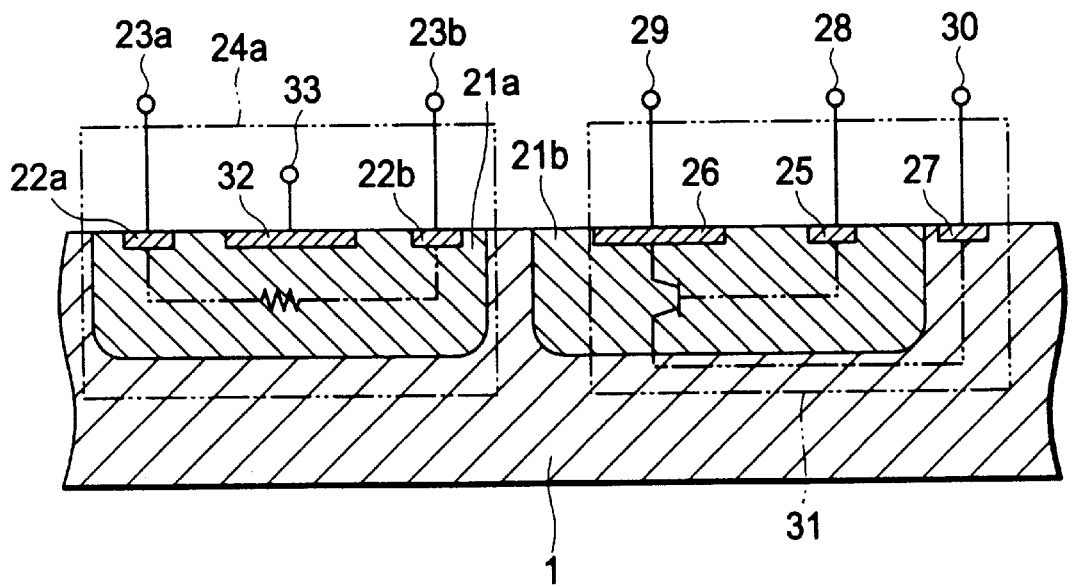

Next, the third embodiment of the present invention will be described. In the embodiment, a P⁺-diffused layer is formed at the surface of the N⁻-well included by a resistor element and a predetermined bias voltage is applied to the P⁺-diffused layer. FIG. 8A is a schematic sectional view showing a CMOS transistor provided in a reference voltage supply circuit according to a third embodiment of the present invention. FIG. 8B is a schematic sectional view showing a resistor and a bipolar transistor provided in the reference voltage supply circuit. In the third embodiment shown in FIGS. 8A and 8B, the same constituents as those in the first embodiment, which are shown in FIGS. 6A and 6B, are indicated by the same marks and detailed description thereon will be omitted.

In the embodiment, a P+-diffused layer 32 is formed at the surface of an N−-well 21a between N+-diffused layers 22a and 22b. A bias terminal 33 is connected to the P+-diffused layer 32. In such a manner, a resistor element 24a may be constructed. Incidentally, the P+-diffused layer 32 is preferably fabricated in the same process as that in which the P+-diffused layers such as P+-diffused layer 26 are fabricated.

In the embodiment constructed in such a manner, when a bias voltage is applied so that a current flowing through the entire resistor element is very large compared with a current flowing through a P-N junction plane between the P+-diffused layer 32 and the N−-well 21a, the P+-diffused layer 32 does not serve as a resistor. That is, a region which works as a resistor is a region other than the P+-diffused layer 32 in the N−-well 21a. Hence, a sectional area of a resistor is reduced compared with the first embodiment and thereby a resistance is substantially increased.

When a bias voltage in a reverse direction with respect to a P-N junction between the P+-diffused layer 32 and the N−-well 21a is further applied to the bias terminal 33, a depletion layer extends into the N−-well 21a side, which acts as a resistor. Since the depletion layer does not serve as a resistor, a resistance of the resistor is further raised.

The depletion layer thus formed acts in a similar way to a junction field effect transistor (JFET). Hence, it is necessary that a reverse bias voltage as large as to cause pinch-off extending the depletion layer to the lower end of the N−-well is not applied.

Further, while in the first embodiment, a width from a semiconductor surface of an N−-well is "LN", a value of the "LN" is replaced with a width "Lrn", in the third embodiment, which is obtained by subtracting a width "LPN" of a depletion layer due to a P-N junction from a base width "LB".

In regard to the width "LPN" of a depletion layer, a relation shown in the following mathematical expression 28 is established, when a reverse bias voltage applied to the bias terminal 33 is "VR", an impurity concentration of the P+diffused layer 32 is "NA", an impurity concentration of the N− well 2 is "ND" and the impurity concentration "ND" is small enough to be negligible compared with the impurity concentration "NA".

$$LPN = \sqrt{\frac{2 \cdot \varepsilon_{si} \cdot (\psi + VR)}{q \cdot ND}} \quad (28)$$

In the mathematical expression 28, a variable "$\varepsilon_{si}$" is a dielectric constant of silicon. Further, a variable "$\Psi$" is called a built-in potential, is a variable dependent on a material forming a P-N junction and a change in the value is small if excluding a change caused by temperature. The variable "$\psi$" is defined by the following mathematical expression 29.

$$\psi = \frac{k \cdot T}{q} \cdot \ln\left(\frac{ND \cdot NA}{ni^2}\right) \quad (29)$$

Further since a substantial width "Lrn" of a resistor can be approximated by a value which is obtained by subtracting the width "LPN" of a depletion layer from a base width "LB", the following mathematical expression 30 is established.

$$Lrn = LB - LPN = LB - \sqrt{\frac{2 \cdot \varepsilon_{si} \cdot (\psi + VR)}{q \cdot ND}} \quad (30)$$

A product of the resistance "R3" and the saturation current "Is" in the embodiment, which is a factor to disperse the output voltage "Vout", is expressed in the following mathematical expression 31.

$$R3 \cdot Is = \frac{k \cdot T \cdot ni^2}{q} \cdot \left(\frac{Lr}{Wr}\right) \cdot \left(\frac{UA}{UD}\right) \cdot \left(\frac{1}{ND \cdot NA}\right) \cdot \frac{1}{LB \cdot Lrn} \quad (31)$$

The width "Lrn" of a resistor in the third embodiment relates to the base width "LB" and the base impurity density "ND" as shown in the mathematical expression 30. That is, in the embodiment as well, a product of the resistance "R3" and the saturation current "Is", which is a factor for dispersion of the output voltage "Vout", is influenced by impurity concentrations and thickness of the emitter and base of a PNP transistor similar to the first embodiment. However, as described above, the impurity concentrations of the emitter and base can be controlled using an ion implantation process to higher precision.

When the second item in the right side of the mathematical expression 30 is small enough to be negligible compared with the first item, the width "Lrn" can be approximated by "LB". In this case, the following mathematical expression 32 is established.

$$R3 \cdot Is = \frac{k \cdot T \cdot ni^2}{q} \cdot \left(\frac{Lr}{Wr}\right) \cdot \left(\frac{UA}{UD}\right) \cdot \left(\frac{1}{ND \cdot NA}\right) \cdot \frac{1}{LB^2} \quad (32)$$

While in the first embodiment, the 4 variables, that are the impurity concentration "ND", the impurity concentration "NA", the width "LN" of the N−-well and the base width "LB", are factors for dispersion, dispersion of the width "LN" can be neglected. Therefore, in the third embodiment, the factors for dispersion becomes 3 variables of the impurity concentrations "ND", "NA" and the width "LB". Accordingly, dispersion of a product of the resistance "R3" and the saturation current "Is" is further reduced and a reference voltage supply circuit with smaller dispersion of an output voltage "Vout" in absolute value is thus constructed.

In the mean time, in order to reduce the second item in magnitude in the right side of the mathematical expression 30, two methods are named. A first one is to apply a voltage in the vicinity of "−Ψ" as a reverse bias voltage, that is to apply a forward bias voltage. A second one is to increase an impurity concentration "ND" of an N−-well. Especially, the second method exerts a fine effect in a semiconductor fabrication process in which a sheet resistance of the N−-well is reduced.

Figure 9:
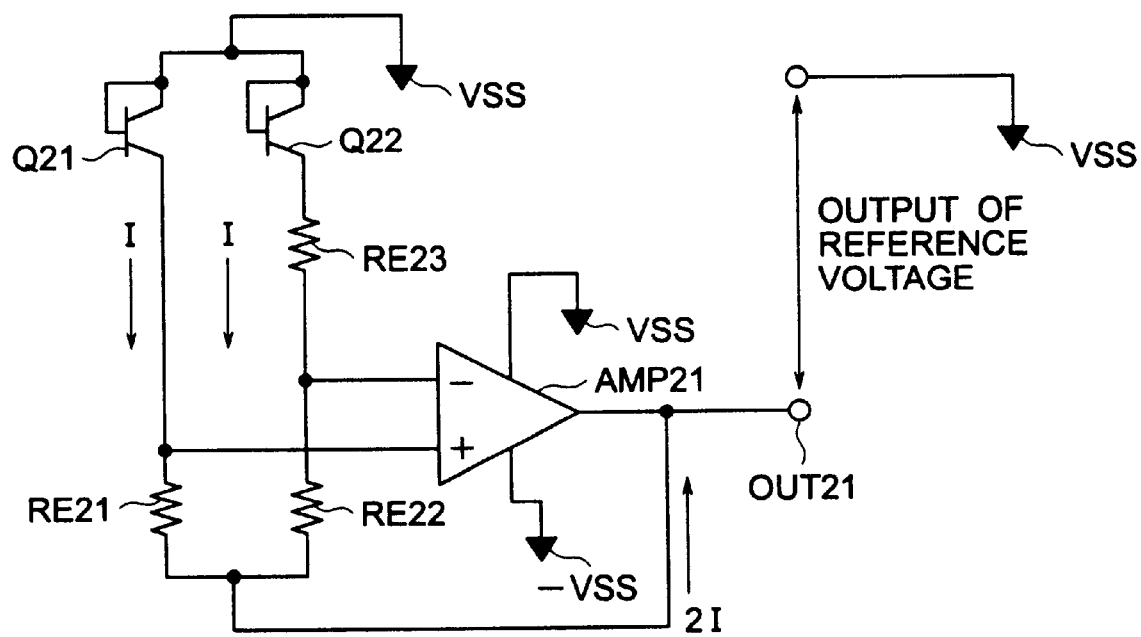
FIG. 9 is a circuit diagram showing a reference voltage supply circuit according to a fourth embodiment of the present invention.

Next, the fourth embodiment will be described. In the embodiment, a conductivity type of each of semiconductor regions is reverse to those of the third embodiment. That is, an N-type semiconductor substrate is used. FIG. 9 is a circuit diagram showing a reference voltage supply circuit according to the fourth embodiment of the present invention.

A reference voltage supply circuit of the embodiment may comprise two NPN transistors Q21 and Q22 whose collectors and bases are set at a potential VSS. A resistor element RE23 and a resistor element RE22 are serially connected to the emitter of the transistor Q22 in the order. Further a resistor element RE21 is connected to the emitter of the transistor Q21. Input terminals of an amplifier AMP21 is connected to a connection point of the emitter of the transistor Q21 and the resistor element RE21 and a connection point of the resistor element RE22 and the resistor element RE23. The resistor element RE22 and the resistor element RE23 are connected to each other and the connection point is connected to an output terminal of the amplifier AMP21. A voltage output terminal OUT21 is connected to the output terminal of the amplifier AMP21. Incidentally, the amplifier AMP21 may include plural elements such as a CMOS transistor. Further, A power supply voltage at a voltage "VSS" or "−VSS" is applied to the amplifier AMP21.

A resistance of the resistor element RE21 is "R21", a resistance of the resistor element RE22 is "R22" and a resistance of the resistor element RE23 is "R23". The resistance "R21" and the resistance "R22" are equal to each other and no change due to temperature occurs in both resistor elements. An emitter junction area of the transistor Q21 is "M" and an emitter junction of the transistor Q22 area is "N". A gain of the amplifier AMP21 is infinite, an input leakage current and an output resistance are both 0, and there is no differential input offset. Besides, base currents of the transistors Q21 and Q22 are as small as to be negligible compared with collector currents.

Figure 10A:
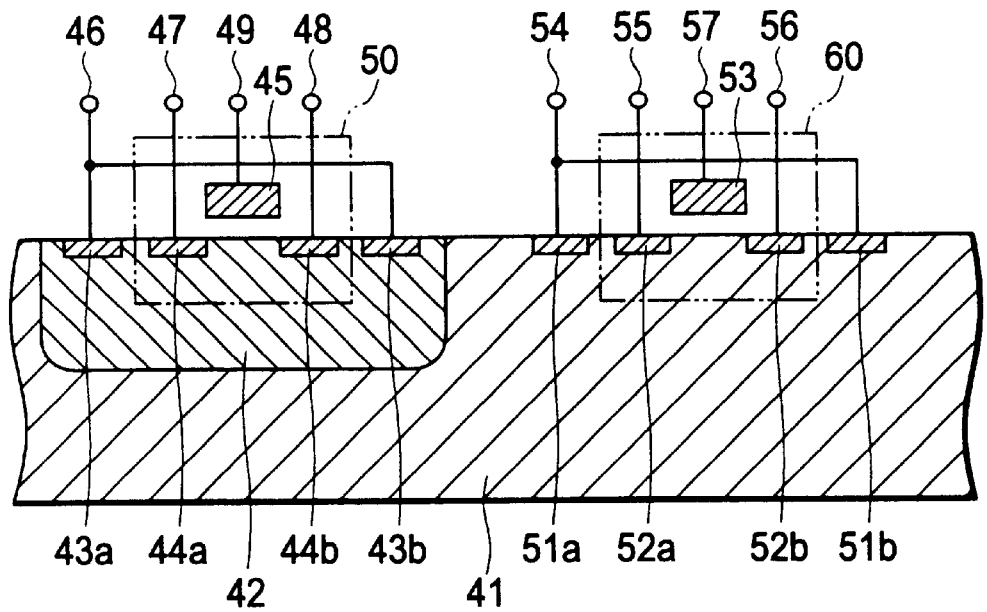
FIG. 10A is a schematic sectional view showing a CMOS transistor provided in a reference voltage supply circuit according to the fourth embodiment of the present invention and FIG. 10B is a schematic sectional view showing a resistor and a bipolar transistor provided in the reference voltage supply circuit.
Figure 10B:
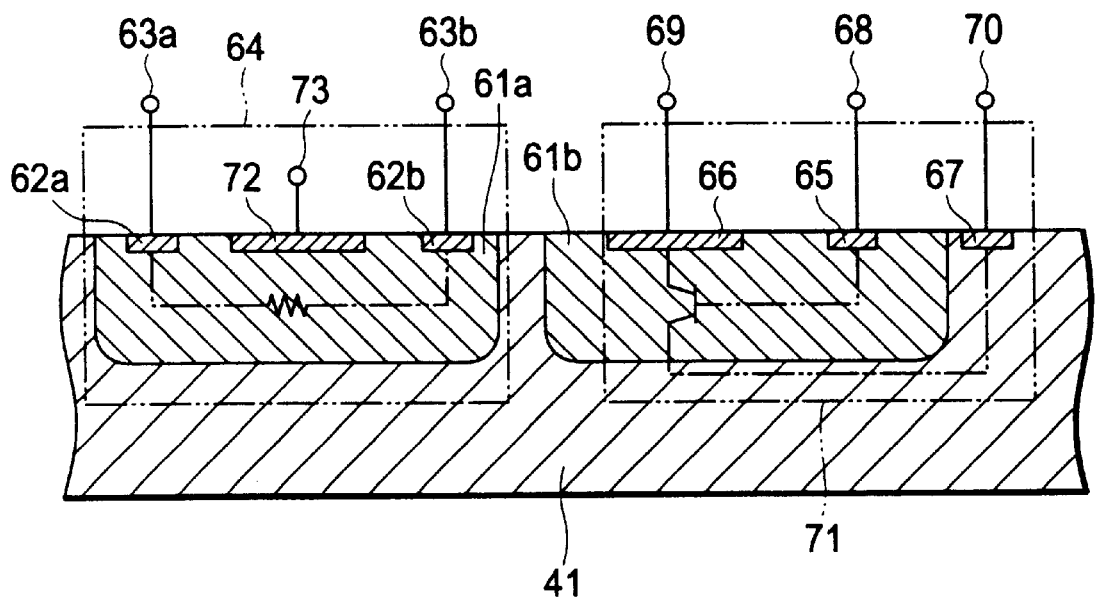

FIG. 10A is a schematic sectional view showing a CMOS transistor provided in a reference voltage supply circuit according to the fourth embodiment of the present invention. FIG. 10B is a schematic sectional view showing a resistor and a bipolar transistor provided in the reference voltage supply circuit.

A CMOS transistor provided in the fourth embodiment is formed at an N⁻-substrate 41, as sown FIG. 10A. A P⁻-well 42 is selectively formed at the surface of the N⁻-substrate 41. Further, two P⁺-diffused layers 43a and 43b are formed at the surface of the P⁻-well 42 and two N⁺-diffused layers 44a and 44b are formed between the P⁺-diffused layers 43a and 43b. Besides, a gate insulating film (not shown) is formed on the P⁻-well 42 between the N⁺-diffused layers 44a and 44b and a gate electrode 45 is formed on the gate insulating film. The gate electrode 45 may be made of polysilicon, for example. A well bias terminal 46 is connected to the P⁺-diffused layers 43a and 43b. A drain terminal 47 is connected to the N⁺-diffused layer 44a. A source terminal 48 is connected to the N⁺-diffused layer 44b. A gate electrode terminal 49 is connected to the gate electrode 45. In such a manner, an N-channel MOS transistor 50 comprising the P⁻-well 42, the two N⁺-diffused layers 44a and 44b, and the gate electrode 45 may be constituted.

Further, two N⁺-diffused layers 51a and 51b are formed at the surface of the N⁻-substrate 41 in a region where the P⁻-well 42 is not formed and two P⁺-diffused layers 52a and 52b are formed between the N⁺-diffused layers 51a and 51b. Further, a gate insulating film (not shown) is formed on the N⁻-substrate 41 between the P⁺-diffused layers 52a and 52b. A gate electrode 53 is formed on the gate insulating film. The gate electrode 53 may be made of polysilicon, for example. A substrate bias terminal 54 is connected to the N⁺-diffused layers 51a and 51b. A drain terminal 55 is connected to the P⁺-diffused layer 52a. A source terminal 56 is connected to the P⁺-diffused layer 52b. A gate electrode terminal 57 is connected to the gate electrode 53. In such a manner, a P-channel MOS transistor 60 comprising the N⁻-substrate 41, the two P⁺-diffused layers 52a and 52b and the gate electrode 53 may be constituted.

On the other hand, a resistor element and a bipolar transistor are, as shown in FIG. 10B, is formed at the N⁻-substrate 41. Two P⁻-wells 61a and 61b are selectively formed at the surface of the N⁻-substrate 41. Further two P⁺-diffused layers 62a and 62b are formed at the surface of the P⁻-well 61a. Terminals 63a and 63b are respectively connected to the P⁺-diffused layers 62a and 62b. Further, an N⁺-diffused layer 72 is formed at the surface of the P—well 61a between P⁺-diffused layers 62a and 62b. A bias terminal 73 is connected to the N⁺-diffused layer 72. In such a manner, a resistor element 64 may be constructed.

A P⁺-diffused layer 65 and an N⁺-diffused layer 66 are formed at the surface of the P⁻-well 61b. A base terminal 68 is connected to the P⁺-diffused layer 65. An emitter terminal 69 is connected to the N⁺-diffused layer 66. A N⁺-diffused layer 67 is formed at the surface of a P⁻-substrate 41 so that the P⁺-diffused layer 65 is placed between the N⁺-diffused layer 66 and 67. A collector terminal 70 is connected to the N⁺-diffused layer 67. In such a manner, an NPN transistor 71 is constructed.

The resistor elements RE21, RE22 and RE23 each have a similar structure to that of the resistor element 64 and the transistors Q21 and Q22 have a similar structure to that of the transistor 71.

In the mean time, the P⁻-wells 42, 61a and 61b are fabricated in the same process. The P⁺-diffused layers 43a, 43b, 52a, 52b, 62a, 62b and 65 are fabricated in the same process. The N³⁰-diffused layers 44a, 44b, 51a, 51b, 66 and 67 are formed in the same process.

In a reference voltage supply circuit of the embodiment constructed in such a manner, there is a necessity to use a negative power supply and a reference voltage output assume a negative value. An output voltage "Vout" is expressed in the following mathematical expression 33 when an emitter-base voltage of the transistor Q12 is "VEB22".

$$Vout = -VBE22 - \left(1 + \frac{R22}{R23}\right) \cdot \frac{k \cdot T}{q} \cdot \ln\left(\frac{N}{M}\right) \tag{33}$$

If a temperature characteristic of the first item and that of the second item in the right side of the mathematical expression 33 are equal, a reference voltage supply circuit with a low temperature dependency may be constructed.

Further, the second item in the right side of the mathematical expression 33 is fully dependent on relative precision if an absolute temperature is excluded.

Since relative precision in an integrated circuit is very high, dispersion of the second item is very small. On the other hand, the voltage "VBE22" of the first item on the right side is dependent on an electrical characteristic of an NPN transistor and a value thereof changes according to a course of fabrication. The voltage "VBE22" is expressed in the following expression 34.

$$VBE22 = \frac{k \cdot T}{q} \cdot \ln\left(\frac{I}{\frac{N}{M} \cdot Is}\right) \tag{34}$$

Further the current "I" is expressed in the following mathematical expression 35.

$$I = \frac{k \cdot T}{R23 \cdot q} \cdot \ln\left(\frac{N}{M}\right) \tag{35}$$

When a value of the current "I" shown in the mathematical expression 35 is substituted into the mathematical expression 34, it is found that a variable to disperse a value of the voltage "VBE22", is mainly a product between the saturation current "Is" and the resistance "R23". The saturation current "Is" is expressed in the following mathematical expression 36 using variables of a diffusion fabrication process.

$$Is = q \cdot M \cdot ni^2 \cdot \left(\frac{Dn}{LB \cdot NA}\right) = M \cdot ni^2 \cdot k \cdot T \cdot \mu_n \cdot \left(\frac{1}{LB \cdot NA}\right) \tag{36}$$

In the mathematical expression 36, a relation shown by the mathematical expression 37 is applied.

$$Dn = \mu_n \cdot \frac{k \cdot T}{q} \tag{37}$$

Further, the resistance "R23" is expressed by the mathematical expression 38 using variables of a diffusion fabrication process.

$$R23 = \frac{Lr}{\mu_p \cdot q \cdot NA \cdot LP \cdot Wr} \tag{38}$$

A product of the saturation current "Is" and the resistance "R23" is expressed by the mathematical expression 39 from the mathematical expressions 37 and 38.

$$R23 \cdot Is = \frac{k \cdot T \cdot ni^2}{q} \cdot \left(\frac{Lr}{Wr}\right) \cdot \left(\frac{\mu_n}{\mu_p}\right) \cdot \left(\frac{1}{NA}\right)^2 \cdot \left(\frac{1}{LB \cdot LP}\right) \tag{39}$$

The mobilities "$\mu_p$" and "$\mu_n$" are in reverse proportion to the impurity concentration "ND" or "NA" and the absolute temperature "T" to the 1.5th power. Therefore, when the mobilities "$\mu_p$" and "$\mu_n$" are expressed using the temperature "T", the impurity concentration "ND" or "NA", and "UC" and "UA" which are both constants, and they are substituted into the mathematical expression 39, the following mathematical expression 40 is derived.

$$R23 \cdot Is = \frac{k \cdot T \cdot ni^2}{q} \cdot \left(\frac{Lr}{Wr}\right) \cdot \left(\frac{UD}{UA}\right) \cdot \left(\frac{1}{ND \cdot NA}\right) \cdot \left(\frac{1}{LB \cdot LP}\right) \tag{40}$$

In the embodiment as well, as shown in the mathematical expression 40, factors by which a product of the resistance "R23" and the saturation current "Is" is dispersed are 4 variables of the emitter impurity concentration "ND", the base impurity concentration "NA", the base width "LB" and the width "LP" of the P⁻-well. Dispersion of each of the variables can be suppressed by controlling an ion implantation process to high precision.

While a circuit construction as in FIG. 9 is also described in "A precision CMOS band gap Reference: " IEEE JOURNAL OF SOLID-STATE CIRCUITS, VOL. SC-19, No. 6, DECEMBER 1984 P1014–1021," the present invention is different from this in that the transistors Q21 and Q22 are different in structure.

Further, in the fourth embodiment, when the VSS terminal is connected to a positive power supply terminal and the "–VSS" terminal is grounded, the reference voltage output "Vout" is required to be taken from the "VSS" terminal on the positive power supply side, though use with a positive power supply is also possible.

What is claimed is:

1. A method of fabricating a reference voltage supply circuit, said reference supply circuit having:

a first conductive type semiconductor substrate;
a bipolar transistor having a second conductive type well for a base formed at the surface of said semiconductor substrate; and
a resistor element connected to an emitter of said bipolar transistor and having a second conductive type well for a resistor at the surface of said semiconductor substrate
wherein said resistor element comprises a first conductive type diffused layer for bias formed between second conductive diffused layers each of the second conductive diffused layers functioning as a resistor electrode, an operational amplifier with at least one input connected to the resistor electrode, and an output providing a reference voltage;
said method comprising the step of fabricating said well for a resistor and said well for a base at the same time.

2. A method of fabricating a reference voltage suppyl circuit, said reference voltage supply circuit having:

a first conductive type semiconductor substrate;
a bipolar transistor having a second conductive type well for a base formed at the surface of said semiconductor substrate; and
a resistor element connected to an emitter of said bipolar transistor and having a second conductive type well for a resistor at the surface of said semiconductor substrate,
wherein said bipolar transistor comprises:
    a first conductive type diffused layer for an emitter electrode formed at a surface of said well for a base;
    a second conductive type diffused layer for a base electrode formed at the surface of said well for a base, an impurity concentration in said diffused layer for a base electrode being higher than that in said well for a base; and
    a first conductive type diffused layer for a collector electrode which is fabricated at the surface of said semiconductor substrate, and
said resistor element comprises:
    second conductive type diffused layers each for a resistor electrode which are fabricated at a surface of said well for a resistor; and
    a first conductive type diffused layer for bias formed between said diffused layers for a resistor electrode, said method comprising the steps of:
fabricating said well for a resistor and said well for a base at the same time;
fabricating said diffused layer for a collector electrode and said diffused layer for an emitter electrode at the same time; and
fabricating said diffused layers each for a resistor electrode and diffused layer for a base electrode at the same time.

3. A method for fabricating a reference voltage supply circuit, said reference voltage supply circuit having:

a first conductive type semiconductor substrate;
a bipolar transistor having a second conductive type well for a base formed at the surface of said semiconductor substrate; and
a resistor element connected to an emitter of said bipolar transistor and having a second conductive type well for a resistor at the surface of said semiconductor substrate,
wherein said bipolar transistor comprises:
    a first conductive type diffused layer for an emitter electrode formed at a surface of said well for a base;
    a second conductive type diffused layer for a base electrode formed at the surface of said well for a base, an impurity concentration in said diffused layer for a base electrode being higher than that in said well for a base;

a first conductive type diffused layer for a collector electrode which is fabricated at the surface of said semiconductor substrate, and said resistor element comprises second conductive type diffused layers each for a resistor electrode which are fabricated at a surface of said well for a resistor, said reference voltage supply circuit further comprising a first conductive type channel MOS transistor, said MOS transistor including:

a second conductive type well for a MOS transistor which is fabricated at the surface of said semiconductor substrate; and a first conductive type diffused layers for a source and a drain which are fabricated at a surface of said well for a MOS transistor, said method comprising the steps of:

fabricating said well for a resistor, said well for a MOS transistor and said well for a base at the same time and with a same material;

fabricating said diffused layer for a collector electrode and said diffused layer for an emitter electrode at the same time;

fabricating said diffused layers each for a resistor electrode and said diffused layer for a base electrode at the same time; and fabricating said diffused layers for a source and a drain at the same time.

4. A method of fabricating a reference voltage supply circuit, said reference voltage supply circuit having:

a second conductive type semiconductor substrate;

a bipolar transistor, said bipolar transistor including:

a first conductive type well for a base formed at a surface of said semiconductor substrate;

a second conductive type diffused layer for an emitter electrode formed at a surface of said well for a base;

a first conductive type diffused layer for a base electrode formed at the surface of said well for a base, an impurity concentration in said diffused layer for a base electrode being higher that that in the well for a base; and a second conductive type diffused layer for a collector electrode which is fabricated at the surface of said semiconductor substrate; and a resistor element connected to an emitter of said bipolar transistor, said resistor element including:

a first conductive type well for a resistor which is fabricated at the surface of said semiconductor substrate;

first conductive type diffused layers each for a resistor electrode which are fabricated at a surface of said well for a resistor; and a second conductive type diffused layer for bias formed between said diffused layers each for a resistor electrode, said method comprising the steps of:

fabricating said diffused layer for a collector electrode, and said diffused layer for an emitter electrode at the same time;

fabricating said well for a resistor and said well for a base at the same time; and fabricating said diffused layers each for a resistor electrode and said diffused layer for a base electrode.

5. The method of fabricating a reference voltage supply circuit according to claim 1, wherein first conductive type is P-type and second conductive type is N-type.

6. The method of fabricating a reference voltage supply circuit according to claim 2, wherein first conductive type is P-type and second conductive type is N-Type.

7. The method of fabricating a reference voltage supply circuit according to claim 3, wherein first conductive type is P-type and second conductive type in N-type.

8. The method of fabricating a reference voltage supply circuit according to claim 4, wherein first conductive type is P-type and second conductive type is N-type.

* * * * *